(12) United States Patent
Sunaga et al.

(10) Patent No.: US 12,406,866 B2
(45) Date of Patent: Sep. 2, 2025

(54) STAMP TOOL, TRANSFER DEVICE, AND ELEMENT ARRAY MANUFACTURING METHOD

(71) Applicant: TDK CORPORATION, Tokyo (JP)

(72) Inventors: Seijiro Sunaga, Tokyo (JP); Makoto Yamashita, Tokyo (JP); Toshinobu Miyagoshi, Tokyo (JP); Yasuo Kato, Tokyo (JP); Tatsunori Otomo, Tokyo (JP); Mitsuyoshi Makida, Tokyo (JP); Yohei Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 400 days.

(21) Appl. No.: 17/915,320

(22) PCT Filed: Mar. 30, 2021

(86) PCT No.: PCT/JP2021/013697
§ 371 (c)(1),
(2) Date: Sep. 28, 2022

(87) PCT Pub. No.: WO2021/201037
PCT Pub. Date: Oct. 7, 2021

(65) Prior Publication Data
US 2023/0187258 A1    Jun. 15, 2023

(30) Foreign Application Priority Data

Mar. 30, 2020 (JP) .................. 2020-060506
Jun. 22, 2020 (JP) .................. 2020-107135
(Continued)

(51) Int. Cl.
H01L 21/67    (2006.01)
B29C 59/02    (2006.01)
(Continued)

(52) U.S. Cl.
CPC ...... H01L 21/67132 (2013.01); B29C 59/026 (2013.01); B41K 3/64 (2013.01);
(Continued)

(58) Field of Classification Search
CPC ... B29C 59/026; Y02P 70/50; H05K 13/0404; H05K 13/04; H01L 21/67132;
(Continued)

(56) References Cited

U.S. PATENT DOCUMENTS

2017/0103908 A1    4/2017  Lew et al.
2017/0173852 A1*   6/2017  Moore ................... H10H 20/01
(Continued)

FOREIGN PATENT DOCUMENTS

CN    108028208 A    5/2018
JP    2017-175087 A  9/2017
(Continued)

OTHER PUBLICATIONS

Translation of JP2017175087.*
(Continued)

Primary Examiner — Sonya M Sengupta
(74) Attorney, Agent, or Firm — Oliff PLC

(57) ABSTRACT

A stamp tool whose transport head can be easily shared, a transport device capable of allowing the stamp tool to easily pick up an transport object element disposed on a surface of a substrate from the substrate and transporting the element without being left on the substrate side, and an element array manufacturing method using the same.

19 Claims, 20 Drawing Sheets

(30) Foreign Application Priority Data

| | | | |
|---|---|---|---|
| Jun. 22, 2020 | (JP) | ................................. | 2020-107138 |
| Dec. 21, 2020 | (JP) | ................................. | 2020-211748 |
| Dec. 21, 2020 | (JP) | ................................. | 2020-211750 |

(51) Int. Cl.
| | |
|---|---|
| *B29L 7/00* | (2006.01) |
| *B41K 3/64* | (2006.01) |
| *B65G 47/90* | (2006.01) |
| *H01L 21/68* | (2006.01) |
| *H01L 21/683* | (2006.01) |
| *H01L 21/687* | (2006.01) |
| *H05K 13/04* | (2006.01) |

(52) U.S. Cl.
CPC ........ *B65G 47/90* (2013.01); *H01L 21/67144* (2013.01); *H01L 21/681* (2013.01); *H01L 21/6838* (2013.01); *H01L 21/68707* (2013.01); *H05K 13/0404* (2013.01); *B29L 2007/00* (2013.01)

(58) Field of Classification Search
CPC ............. H01L 21/67144; H01L 21/677; H01L 21/681; H01L 21/6838; H01L 21/68707; H01L 2224/95; H01L 21/02; H01L 21/50; H01L 21/683; H01L 21/687; H01L 2224/09; H01L 24/97; H01L 2924/12041; B65G 47/90; B29L 2007/00; B41F 17/001; B41F 17/24; B41K 3/64; B41K 99/00

See application file for complete search history.

(56) References Cited

U.S. PATENT DOCUMENTS

| | | | |
|---|---|---|---|
| 2019/0067237 A1 | 2/2019 | Kitazawa | |
| 2020/0006279 A1 | 1/2020 | Kitazawa | |
| 2020/0286850 A1 | 9/2020 | Seyama et al. | |
| 2021/0050242 A1 | 2/2021 | Sakata et al. | |
| 2021/0335747 A1 | 10/2021 | Kitazawa | |
| 2022/0124949 A1 | 4/2022 | Nakagawa et al. | |
| 2023/0187258 A1* | 6/2023 | Sunaga | H05K 13/04 414/751.1 |

FOREIGN PATENT DOCUMENTS

| | | |
|---|---|---|
| JP | 2018-533212 A | 11/2018 |
| TW | 201836043 A | 10/2018 |

OTHER PUBLICATIONS

NPL. cites 1 & 2, Publication Nos. US2019/0067237A1, US2020/0006279A1, and US2021/0335747A1 previously cited in an Information Disclosure Statement in the present application on Sep. 28, 2022.

Oct. 10, 2024 Non-Final Rejection received in U.S. Appl. No. 17/915,349.

Feb. 28, 2025 Office Action issued in U.S. Appl. No. 17/915,349.

Sep. 29, 2022 International Preliminary Report on Patentability issued in International Patent Application No. PCT/JP2021/013698.

Sep. 29, 2022 International Preliminary Report on Patentability issued in International Patent Application No. PCT/JP2021/013697.

U.S. Appl. No. 17/915,349, filed Sep. 28, 2022 in the name of Seijiro Sunaga et al.

* cited by examiner

STAMP TOOL, TRANSFER DEVICE, AND ELEMENT ARRAY MANUFACTURING METHOD

TECHNICAL FIELD

The present invention relates to a stamp tool, a transport device, and an element array manufacturing method.

BACKGROUND ART

In transport of an extremely small part, use of a stamp-shaped transport tool (stamp tool) having a large number of projections on a surface thereof has been studied. Patent Document 1 below discloses an example of the stamp-shaped transport tool. Conventionally, a stamp tool for allowing detachment of an object to be transported by a coefficient of thermal expansion has been disclosed.

An LED element referred to as a mini-LED or a micro-LED is an example of an extremely small part assumed to be an object to be transported of a stamp tool. The mini-LED or the micro-LED has a width of 1 to 8 μm, a length of 5 to 10 μm, and a height of 0.5 to 3 μm, which are extremely smaller than those of a conventional general LED element.

As in a conventional art, an LED display is manufactured by picking up elements from a wafer on which a plurality of such LED elements is disposed and transporting the elements to a substrate corresponding to a display, and wafers to which LEDs are supplied vary widely depending on the wafer makers and applications.

When transporting the LED elements to the substrate, wafers having different specifications may be exchanged. In this case, it is necessary to use a stamp tool corresponding to each wafer. The stamp tool is replaceably attached to a tip of a general adsorbing mechanism-attached head (transport head). In addition, it is necessary to prepare a plurality of types of transport heads for each of a plurality of types of stamp tools, which complicates the transport device.

Moving to a stamp is performed by bringing adhesive projections formed on the surface of the stamp tool attached to this transport head into contact with an LED on the wafer. At this time, when the stamp tool comes into contact with the surface of the wafer on which the LEDs are fixed, there is a risk that the stamp tool will detach from the transport head due to adhesion of the wafer surface to the stamp tool becoming stronger than an adsorption force of the transport head to the stamp tool.

In particular, when a size of a part, which is an object to be transported, becomes smaller, a size of the projections of the stamp tool becomes smaller accordingly, and thus a possibility that a flat surface other than the projections will come into contact with a wafer surface increases. When contact of the flat surface of the stamp tool occurs, the contact area increases. Thus, unintended adhesion acts on the stamp tool, which causes a problem in that "the stamp tool adheres to the substrate side such as the wafer and cannot be removed."

[Patent Document 1] US 2017/0173852 A1

SUMMARY

The present invention has been made in view of such circumstances, and an object of the present invention is to provide a stamp tool whose transport head can be easily shared, a transport device capable of allowing the stamp tool to easily pick up an transport object element disposed on a surface of a substrate from the substrate and transporting the element without being left on the substrate side, and an element array manufacturing method using the same.

To achieve the above-mentioned object, a stamp tool according to the present invention includes a stamp layer having a portion allowing an transport object element to detachably adhere thereto, a support plate, the stamp layer being fixed to the support plate, and an adapter plate replaceably attached to the support plate and having a mounting surface, a transport head being allowed to be detachably attached thereon.

With the stamp tool according to the present invention, only the support plate to which the stamp layer is fixed can be replaced from the adapter plate without replacing the entire stamp tool. Therefore, it becomes easier to prepare a stamp tool having different types of stamp layers at low cost. In addition, even when the size of the stamp layer or the size of the support plate is changed, it becomes easy to unify the size of the adapter plate, and it becomes easy to share the transport head or an installation stage. In addition, since the stamp layer is fixed to the support plate, it is easy to ensure a degree of flatness of the stamp surface of the stamp layer.

Preferably, the support plate is replaceably attached to the adapter plate by an adhesive layer. By using the adhesive layer, the support plate can be easily replaceably attached to the adapter plate, and the degree of flatness of the support plate, that is, the degree of flatness of the stamp surface of the stamp layer can be easily ensured.

Preferably, the transport object element has elements formed on a surface of a substrate, projections corresponding to the elements are formed on the stamp layer, and the elements detachably adhere to the respective projections. With such a configuration, it becomes easy to take out a plurality of elements as a plurality of transport object elements from the substrate at the same time and transfer or mount the elements.

Preferably, the support plate has a glass plate or a ceramic plate having a flat surface. With such a configuration, it is easy to ensure the degree of flatness of the support plate, that is, the degree of flatness of the stamp surface of the stamp layer. In addition, in particular, when the support plate is made of a glass plate, it becomes easier to form an adsorbable surface around the stamp layer.

Preferably, a tapered surface having an outer diameter decreasing toward the support plate is formed on a side surface of the adapter plate. A claw portion of a clamping mechanism (also referred to as a chuck mechanism) can be detachably engaged with the tapered surface formed on the side surface of the adapter plate. In addition, a mounting force of the stamp tool to the transport head by the clamping mechanism can be increased. Further, positioning of the stamp tool is facilitated along an inclined surface of a guide member installed in an upper part of the installation stage for the stamp tool.

Preferably, a maximum width of the adapter plate is set to be larger than a width of the support plate. With such a configuration, engagement between the inclined surface of the guide member and the tapered surface of the stamp tool is facilitated.

Preferably, an insertable surface facing the tapered surface of the adapter plate is provided on a surface of the support plate at a side of the adapter plate. The presence of the insertable surface on the support plate of the stamp tool facilitates detachable engagement of the claw portion of the clamping mechanism with the tapered surface on the side surface of the adapter plate.

Preferably, an adsorbable surface is formed around the stamp layer on a surface of the support plate at a side of the stamp layer. When the adsorbable surface is present on the support plate of the stamp tool, the support plate can be adsorbed on a top surface of the installation stage for the stamp tool, which facilitates sealing and holding the stamp layer inside the housing recess. The stamp layer in the housing recess is kept clean.

A shim plate for adjusting a degree of parallelism (a degree of flatness) of the support plate may be interposed between the stamp layer and the adapter plate. With such a configuration, the degree of flatness of the support plate is improved, and the degree of flatness of the stamp surface is improved.

A method of manufacturing an element array according to the present invention includes taking out transport object elements from a substrate simultaneously and transporting the elements using any one of the above-described the stamp tools. In the method of manufacturing an element array according to the present invention, the element array having the plurality of elements can be easily manufactured.

In addition, to achieve the above-mentioned object, a transport device according to the present invention is a transport device including a stamp tool, and
a transport head configured to detachably transport the stamp tool, in which
the stamp tool includes
a stamp layer allowing an transport object element disposed on a substrate with a predetermined fixing force F1 to adhere into the stamp layer with predetermined adhesion force F2, and
an adapter plate configured to support the stamp layer, having a mounting surface allowing the transport head to be detachably attached thereon,
a mounting force F3 to the mounting surface of the adapter plate by the transport head is greater than the fixing force F1, and
the adhesion force F2 of the stamp layer to the transport object element is greater than the fixing force F1.

In the transport device according to the present invention, the mounting force F3 to the mounting surface of the adapter plate by the transport head is greater than the fixing force F1, and the adhesion force F2 of the stamp layer to the transport object element is greater than the fixing force F1. Therefore, the stamp tool can easily pick up and transport the transport object element disposed on the surface of the substrate from the substrate without being left on the substrate side.

Preferably, the mounting force F3 to the mounting surface of the adapter plate by the transport head includes a primary mounting force F3a by a primary attaching means and a secondary mounting force F3b by a secondary attaching means other than the primary attaching means. Preferably, the primary attaching means includes a vacuum suction hole formed in the transport head. By only providing the secondary attaching means to a general transport head having the vacuum suction hole, the mounting force F3 to the mounting surface of the adapter plate by the transport head is easily set to be larger than the fixing force F1 of the transport object element with respect to the substrate.

Preferably, the secondary attaching means includes at least one of a clamping mechanism (also referred to as a chuck mechanism) for detachably attaching the adapter plate to the transport head, an electrostatic adsorption mechanism, a fitting mechanism, and a screwing mechanism. By providing these mechanisms to the transport head, it becomes easy to set the mounting force F3 to the mounting surface of the adapter plate by the transport head to be greater than the fixing force F1 of the transport object element with respect to the substrate.

Preferably, a tapered surface having an outer diameter decreasing toward the stamp layer is formed on a side surface of the adapter plate. In addition, preferably, a claw portion of a clamping mechanism included in the secondary attaching means is allowed to be engaged with the tapered surface formed on the side surface of the adapter plate. With such a configuration, the claw portion of the clamping mechanism can easily be detachably engaged with the tapered surface on the side surface of the adapter plate. In addition, the mounting force F3 of the stamp tool with respect to the transport head by the clamping mechanism can be increased.

The stamp tool further includes a support plate on which the stamp layer is fixed and to which the adapter plate is replaceably attached to the support plate. With such a configuration, only the support plate to which the stamp layer is fixed can be replaced from the adapter plate without replacing the entire stamp tool. Therefore, it becomes easier to prepare a stamp tool having different types of stamp layers at low cost.

Preferably, the support plate is replaceably attached to the adapter plate by an adhesive layer. The adhesion by this adhesive layer is preferably larger than the fixing force F1 of the transport object element with respect to the substrate.

The transport object element may have elements formed on a surface of a substrate, and preferably, a plurality of projections corresponding to the elements is formed on the stamp layer, and the elements detachably adhere to the respective projections. With such a configuration, the plurality of elements as the plurality of transport object elements can be taken out from the substrate at the same time.

A method of manufacturing an element array according to the present invention includes a step of simultaneously taking out and transporting a plurality of elements as a plurality of transport object elements from the substrate simultaneously and transporting the elements using any one of the above-described transport devices. The method of manufacturing the element array according to the present invention can easily manufacture an element array having a plurality of elements.

DETAILED DESCRIPTION

Figure 1A:
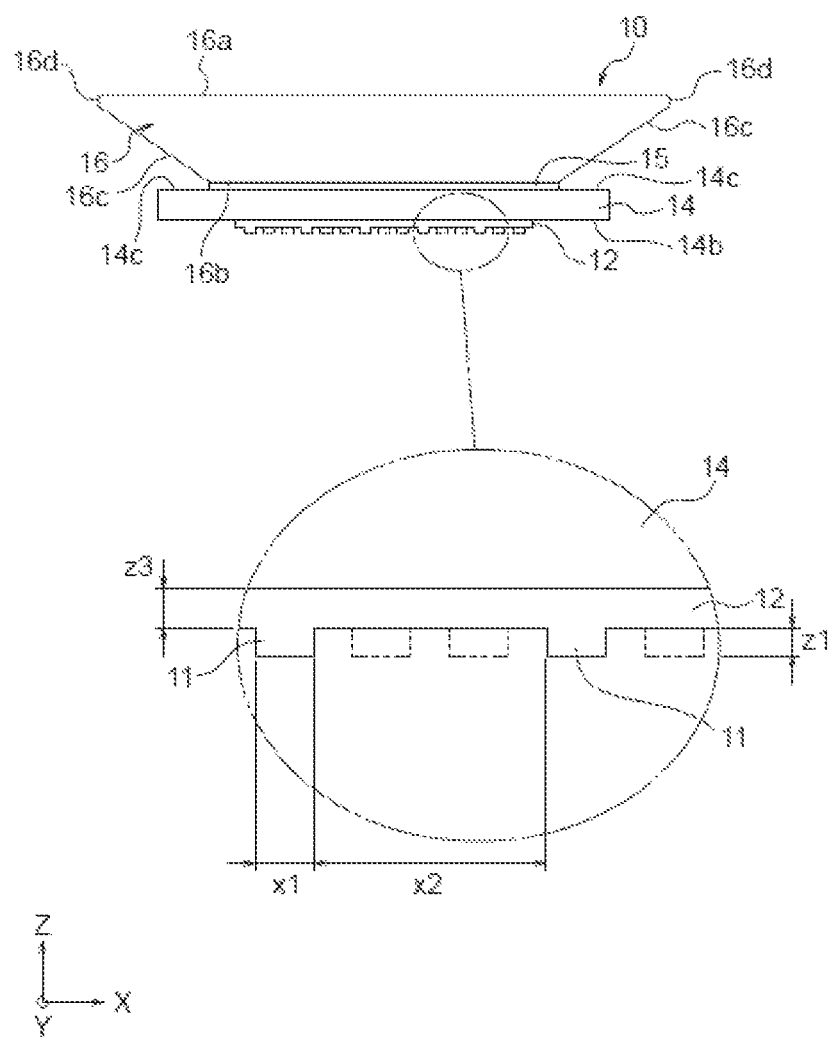
FIG. 1A is a schematic front view and a main part enlarged view of a stamp tool used in a transport device according to an embodiment of the present invention.

Hereinafter, the present invention will be described based on embodiments illustrated in the drawings.

First Embodiment

Figure 2A:
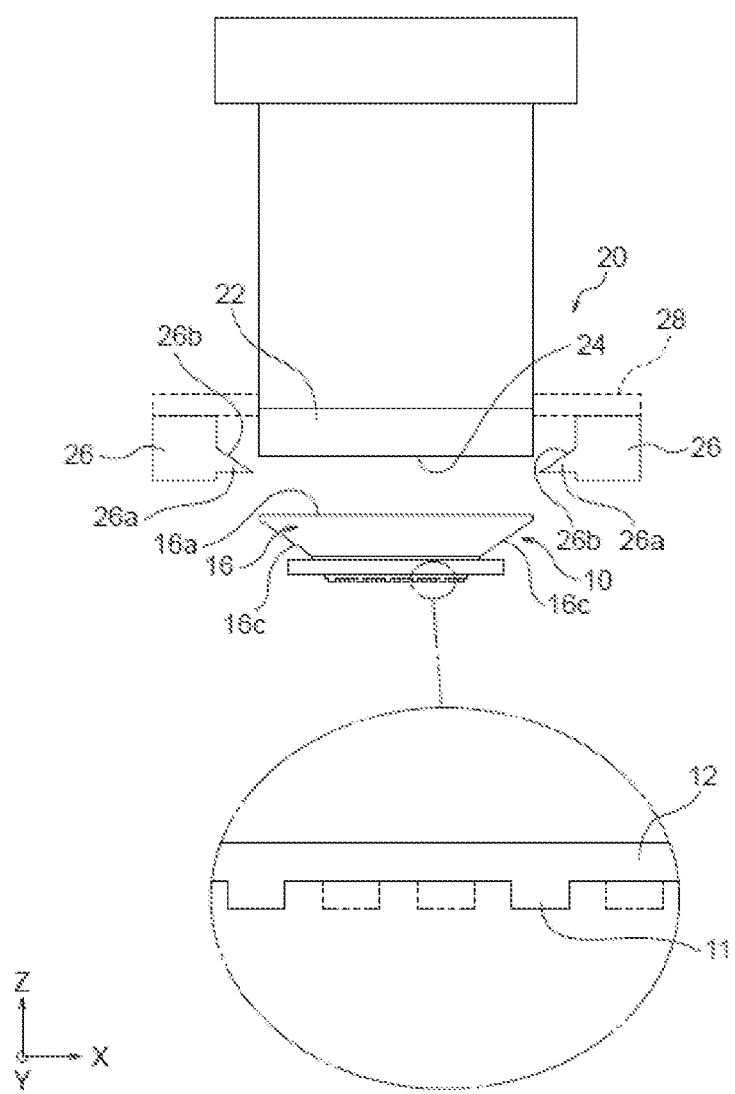
FIG. 2A is a schematic diagram of a transport device including a transport head that detachably transports the stamp tool illustrated in FIG. 1A.

As illustrated in FIG. 2A, a transport device 20 according to the present embodiment includes a stamp tool 10 and a transport head 22. As illustrated in FIG. 1A, the stamp tool 10 includes a stamp layer 12, a support plate 14, and an adapter plate 16.

On the stamp layer 12, projections 11 protruding downward along a Z-axis are formed in a matrix at predetermined intervals in an X-axis direction and a Y-axis direction. For example, an X-axis direction width x1 of the projections 11 and an X-axis direction interval x2 of adjacent projections 11 are determined according to an X-axis direction width x3, an X-axis direction interval x4, etc. of elements (an example of an transport object element) 32r for red light emission mounted on a surface of a mounting substrate (the substrate may be a sheet, which is similarly applied hereinafter) illustrated in FIG. 5F.

Note that although not illustrated in FIG. 1A, the above description is similarly applied to a Y-axis direction width of the projections 11 and a Y-axis direction interval of adjacent projections 11. The projections 11 are disposed in a matrix on a lower surface of the stamp layer 12, and the number of projections disposed is not particularly limited, and is one to several hundred thousand.

In the present embodiment, in the drawings, an X-axis (first axis), a Y-axis (second axis), and the Z-axis (third axis) are substantially perpendicular to one another, the X-axis and Y-axis are parallel to a planar direction of the stamp layer 12, and the Z-axis is parallel to a direction in which the projections 11 protrude.

Figure 5A:
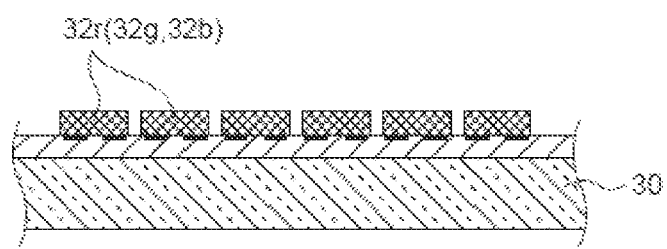
FIG. 5A is a schematic cross-sectional view of the element formed on the semiconductor substrate.
Figure 5A:
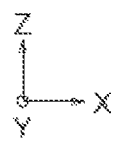
Figure 5B:
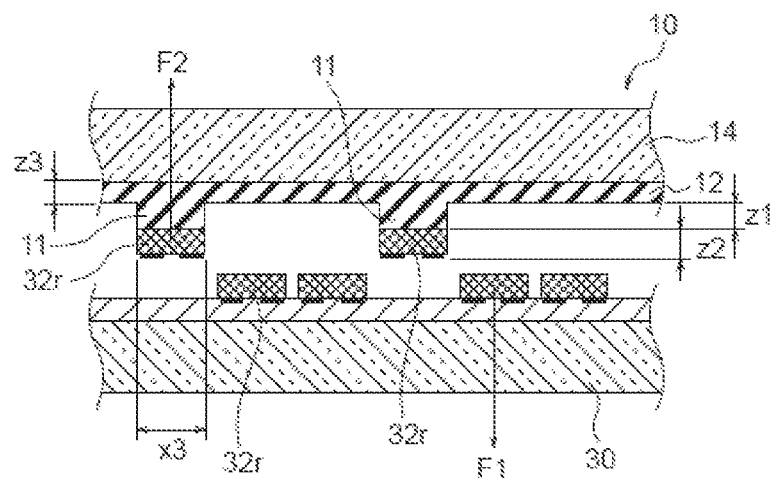
FIG. 5B is a schematic cross-sectional view illustrating a state in which the element on the semiconductor substrate is picked up by the stamp tool of the transport device.
Figure 5B:
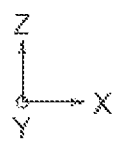

As illustrated in FIG. 1A, a protrusion height z1 of the projections 11 of the stamp layer 12 is determined in relation to a Z-axis direction height z2 of the elements 32r illustrated in FIG. 5B, and is preferably, for example, 1 to 8 times the Z-axis direction height z2. A Z-axis direction thickness z3 of the stamp layer 12 is not particularly limited, and is preferably about 0.25 times or more the protrusion height z1 of the projections 11. Note that the X-axis direction width x3 (the Y-axis direction width is about the same) of the elements 32r is, for example, 1 to 150 μm, and the height z2 is, for example, 1 to 150 μm.

The stamp layer 12 and the projections 11 may be made of different materials as long as the stamp layer 12 and the projections 11 are strongly bonded, or may be made of the same material. By using the same material, a possibility that the projections 11 will be peeled from the stamp layer 12 is reduced. At least the projections 11 are made of an adhesive material, and are configured to allow the elements 32r disposed with a predetermined fixing force F1 on an element forming substrate 30 illustrated in FIG. 5B to adhere thereto with predetermined adhesion force F2. The material and shape of the projections 11 are determined so that, when a lower end of a projection 11 is pressed against an upper surface of an element 32r with a predetermined force, the adhesion force F2 of the projection 11 with respect to the element 32r becomes greater than the fixing force F1 of the element 32r with respect to the substrate 30.

The material of the projections 11 is not particularly limited, and examples thereof include polydimethylsiloxane (PDMS), organosilicon compounds, and viscoelastic elastomer such as polyether rubber. The stamp layer 12 may be made of the same material as that of the projections 11, and a surface of the stamp layer 12 other than the projections 11 is preferably non-adhesive. It is preferable not to pick up the elements 32r by adhesion except for the projections 11.

As illustrated in FIG. 1A, the stamp layer 12 is fixed to support plate 14. The support plate 14 is made of a material having higher rigidity and a superior degree of flatness than the stamp layer 12, and is preferably made of a glass plate, a metal plate, a ceramic plate, etc. A thickness of the support plate 14 is not particularly limited, and is preferably 0.5 mm or more.

The stamp layer 12 may be formed directly on a surface of the support plate 14, or may be fixed by an adhesive layer. In any case, the stamp layer 12 is fixed to the surface of the support plate 14 with a sticking force sufficiently higher than the adhesion force F2 illustrated in FIG. 5B. In a post-process, the element 32r is peeled off from the projection 11 and disposed on, for example, a first transfer substrate (sheet) 50 illustrated in FIG. 5C. Thus, at that time, it is important that the stamp layer 12 does not peel off from the support plate 14.

As illustrated in FIG. 1A, the support plate 14 is detachably fixed to an adhesive surface 16b of the adapter plate 16 by an adhesive layer 15 on a surface opposite to the stamp layer 12. Adhesion between the support plate 14 and the adapter plate 16 by the adhesive layer 15 is adhesion sufficiently higher than the adhesion force F2 illustrated in FIG. 5B. However, the support plate 14 can be removed from the adhesive surface 16b of the adapter plate 16 when replacing the stamp layer 12 after repeated use. The adhesive layer 15 may include a double-sided adhesive tape, etc.

An X-axis direction width and a Y-axis direction width of the support plate 12 are preferably larger than those of the stamp layer 12, and larger than an X-axis direction width and a Y-axis direction width of the adhesive surface 16b of the adapter plate 16. On a surface of the support plate 14 on the stamp layer side, a flat adsorbable surface 14b, on which the stamp layer 12 is not formed, is formed around the stamp layer 12. In the present embodiment, the stamp layer 12 has a rectangular shape when viewed in the Z-axis direction. However, the support plate 14 may have a rectangular or circular shape. The adsorbable surface 14b can be detachably attached to a top surface of an installation stage 82 illustrated in FIG. 7.

An upper surface of the adapter plate 16 opposite to the adhesive surface 16b is a flat mounting surface 16a. At least both side surfaces of the adapter plate 16 in the X-axis direction are tapered surfaces 16c so that the area of the mounting surface 16a is larger than the area of the adhesive surface 16b. That is, the tapered surface 16c, outer diameters of which decrease toward the stamp layer 12, are formed on at least the side surfaces of the adapter plate 16 in the X-axis direction. The tapered surfaces 16c may be formed on both side surfaces of the adapter plate 16 in the Y-axis direction, or the tapered surfaces 16c may be formed along the entire circumference of the side surfaces of the adapter plate 16.

In the present embodiment, the tapered surfaces 16c are also formed on the both side surfaces of the adapter plate 16 in the Y-axis direction, and the tapered surfaces 16c are formed along the entire circumference of the side surfaces of the adapter plate 16. In the present embodiment, the adapter plate 16 has a rectangular shape when viewed in the Z-axis direction, and at least a maximum X-axis direction width of the adapter plate 16 is preferably larger than the X-axis direction width of the support plate 14. Note that as illustrated in FIG. 7, a maximum Y-axis direction width of the adapter plate 16 may be substantially equal to the Y-axis direction width of the support plate 14, or may be larger or smaller than the Y-axis direction width of the support plate 14.

Figure 2B:
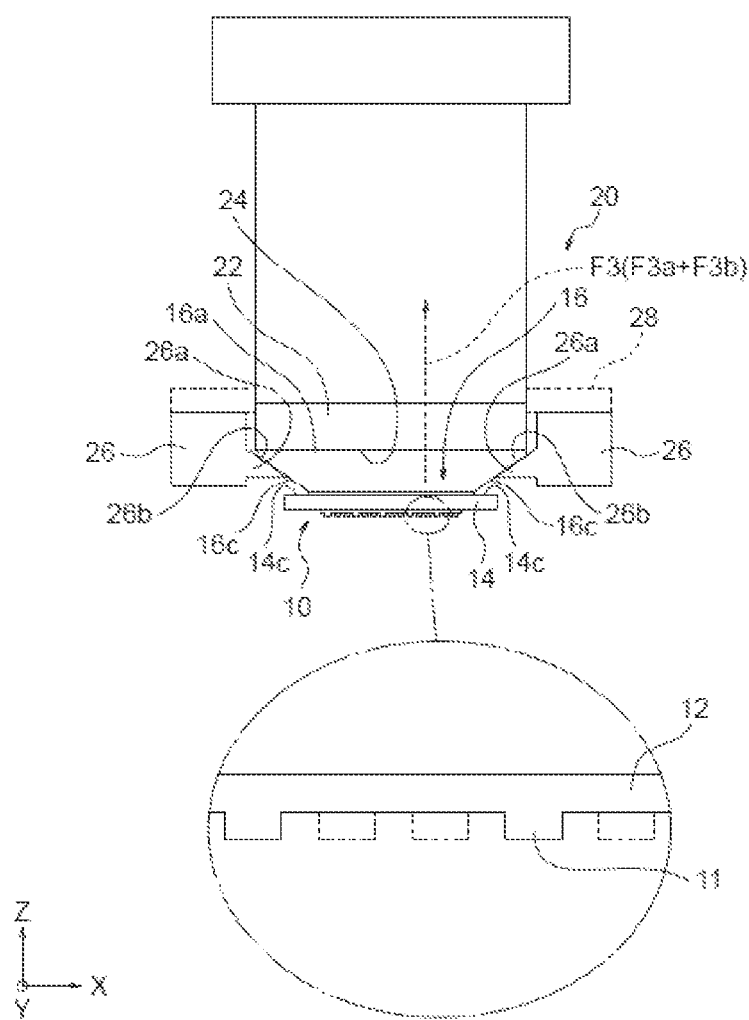
FIG. 2B is a schematic diagram of a transport device illustrating a state in which the stamp tool is gripped by the transport head illustrated in FIG. 2A.

On a surface of the support plate 14 opposite to the adsorbable surface 14b illustrated in FIG. 1A, a flat insertable surface 14c facing the tapered surfaces 16c is formed around the adhesive surface 16b of the adapter plate 16. On the insertable surface 14c located on both sides in the X-axis direction, a claw portion 26a of a chuck mechanism 26 illustrated in FIG. 2B is engaged with each of the tapered surfaces 16c of the adapter plate 16. In addition, an inclined surface 89 of a guide member 88 of an installation stage 82 illustrated in FIG. 6 is engaged with each of the tapered surfaces 16c of the adapter plate 16 located on both sides in the X-axis direction.

A thickness of the adapter plate 16 illustrated in FIG. 1A in the Z-axis direction is sufficiently larger than the thickness of the support plate 14, and is preferably 1.2 times or more, and preferably about 2 to 6 times the thickness of the support plate 14. Note that an edge portion 16d including a chamfered portion or an R-portion is formed on an outer peripheral edge portion of the mounting surface 16a on the upper surface of the adapter plate 16. Note that it is preferable that a chamfered portion or an—R portion is formed on the outer peripheral edge portion of the mounting surface 16a on the upper surface of the adapter plate 16.

Figure 6:
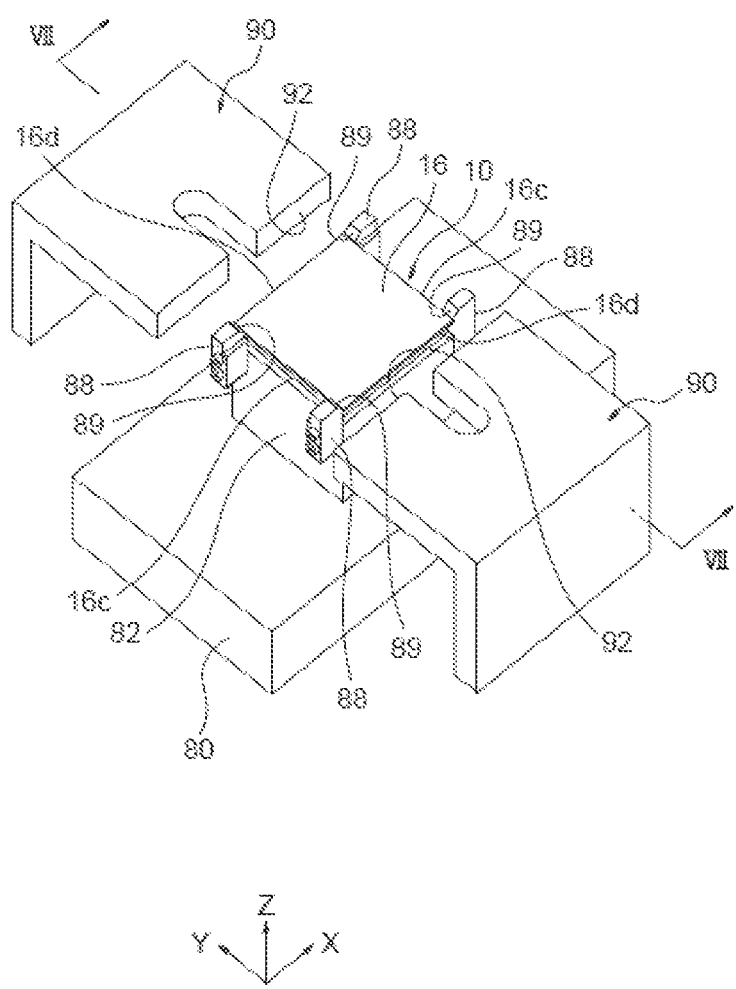
FIG. 6 is a schematic perspective view of a stamp stage on which the stamp tool illustrated in FIG. 1A is installed.
Figure 7:
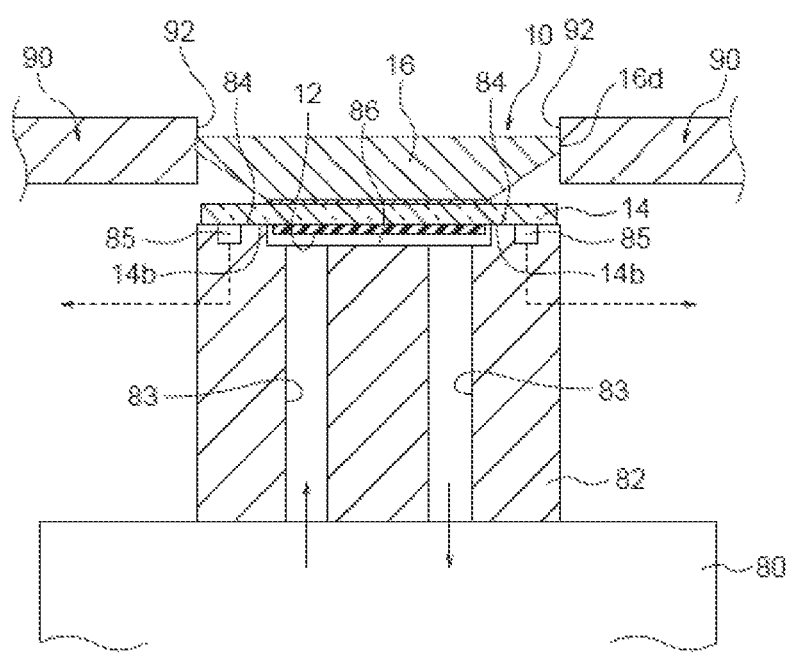
FIG. 7 is a schematic cross-sectional view of the stamp stage taken along line VII-VII illustrated in FIG. 6.

Tip surfaces 92 of a pair of positioning members 90 illustrated in FIGS. 6 and 7 come into contact with edge portions 16d of the adapter plate 16 located on both sides in the Y-axis direction to position a Y-axis direction position of the stamp tool 10 placed on the installation stage 82. Positioning of an X-axis direction position of the stamp tool 10 is performed by the inclined surface 89 of the guide member 88 of illustrated in FIG. 6 and a claw portion 26a of a clamping mechanism 26 of the transport device 20 illustrated in FIG. 2B.

An adsorbing surface 24 of the transport head 22 of the transport device 20 illustrated in FIG. 2A can be adsorbed to the mounting surface 16a on the upper surface of the adapter plate 16. A vacuum suction hole serving as a primary attaching means is formed on the adsorbing surface 24 of the transport head 22, and by generating a negative pressure in the vacuum suction hole, the mounting surface 16a of the adapter plate 16 of the stamp tool 10 is vacuum-adsorbed to the adsorbing surface 24. A vacuum adsorption force of the adsorbing surface 24 to the mounting surface 16a of the adapter plate 16 of the stamp tool 10 is assumed to be a primary mounting force F3a.

In addition, in the present embodiment, the chuck mechanism 26 is attached on the transport head 22 via an opening/closing mechanism 28. The claw portion 26a is formed inside the chuck mechanism 26. The chuck mechanism 26 including the claw portion 26a is moved, for example, in the X-axis direction by the opening/closing mechanism 28, so that the claw portion 26a opens the entire lower surface of the adsorbing surface 24 as illustrated in FIG. 2A, or the claw portion 26a is located below each of both sides of the adsorbing surface 24 in the X-axis direction as illustrated in FIG. 2B.

A tapered engaging surface 26b is formed on each claw portion 26a. The tapered surface of the engaging surface 26b is adapted to a shape of the tapered surface 16c of the adapter plate 16 of the stamp tool 10, and can be engaged with the tapered surface 16c. As illustrated in FIGS. 2A and 2B, before the mounting surface 16a of the adapter plate 16 is adsorbed to the adsorbing surface 24 of the transport head 22, the claw portion 26a of the chuck mechanism 26 is opened by the opening/closing mechanism 28. After the mounting surface 16a of the adapter plate 16 is adsorbed to the adsorbing surface 24 of the transport head 22, the chuck mechanism 26 moves in a direction in which the claw portion 26a is closed by the opening/closing mechanism 28, and the engaging surface 26b is engaged with the tapered surface 16c.

As a result, the stamp tool 10 is attached on the transport head 22 with a total mounting force F3 of a primary mounting force F3a generated by a vacuum suction hole serving as a primary attaching means formed in the transport head 22 and a secondary mounting force F3b generated by the chuck mechanism 26 as serving as a secondary attaching means. As the transport head 22 becomes smaller, the primary mounting force F3a alone generated by the vacuum suction hole of the transport head 22 tends to hardly become larger than the fixing force F1 illustrated in FIG. 5B. In the present embodiment, when the secondary mounting force F3b generated by the chuck mechanism 26 serving as the secondary attaching means is added to the primary mounting force F3a, the total mounting force F3 (=F3a+F3b) reliably becomes larger than the fixing force F1.

Next, a description will be given of a method for manufacturing a display element array using the transport device 20 having the stamp tool 10 according to present embodiment.

First, the transport device 20 illustrated in FIG. 2A picks up the stamp tool 10 disposed on the installation stage 82 illustrated in FIG. 6. In the present embodiment, at least three stamp tools may be prepared, for example for the three primary colors of light R, G and B, and each stamp tool is preferably installed on each installation stage 82. Alternatively, the installation stage 82 is replaced with respect to a base 80 for each of the stamp tools 10 for R, G and B.

In the following description, one installation stage 82 will be described. As illustrated in FIGS. 6 and 7, the block-shaped installation stage 82 is installed on the base 80 in a detachable and replaceable manner using bolts, etc. As illustrated in FIG. 7, a housing recess 86 and a top surface 84 surrounding the housing recess 86 are formed in an upper part of the installation stage 82 in the Z-axis direction. The housing recess 86 is formed, for example, by counterbore-molding a center of an upper surface of the square pole-shaped stage 82. As illustrated in FIG. 7, the housing recess 86 is adapted to completely accommodate the stamp layer 12 of the stamp tool 10.

In addition, suction holes 85 are formed at a plurality of locations in a circumferential direction on the top surface 84 formed around the housing recess 86 to detachably adsorb and hold the adsorbable surface 14b of the support plate 14 on the top surface 84. In addition, a plurality of gas flow holes 83 formed in the stage 82 communicates with the housing recess 86. By adsorbing the adsorbable surface 14b of the support plate 14 on the top surface 84, the housing recess 86 can be sealed except for the gas flow holes 83. By allowing cleaning gas to flow into a housing space 86 through the gas flow holes 83, dust and impurities adhering to the stamp layer 12 can be discharged to the outside.

Two guide members 88 are detachably attached by bolts, etc. at each side of the stage 82 on both side surfaces substantially perpendicular to the X-axis. The inclined surface 89 is formed on an upper side of an inner surface of the guide member 88. The tapered surface 16c of the adapter plate 16 illustrated in FIG. 1A can be in contact with each inclined surface 89, and the tapered surface 16c of the adapter plate 16 facing in the X-axis direction slides along each inclined surface 89. Therefore, the adapter plate 16 of the stamp tool 10 is dropped onto the stage 82 while sliding on the inclined surface 89, and the stamp layer 12 is housed inside the housing recess 86 as illustrated in FIG. 7. In addition, rough positioning of the stamp tool 10 with respect to the stage 82 in the X-axis direction is performed.

As illustrated in FIG. 6, four guide members 88 are attached to the stage 82 so as to be located inside both edge portions 16d of the adapter plate 16 of the stamp tool 10 in the Y-axis direction. The positioning members 90 in the Y-axis direction are disposed on both sides of the stage 82 in the Y-axis direction so as to be movable in the Y-axis direction. The tip surfaces 92 are formed on the positioning members 90, respectively, these tip surfaces 92 face each other along the Y-axis, and each of the tip surfaces 92 can come into contact with the edge portion 16d of the adapter plate 16 in the Y-axis direction as illustrated in FIG. 7. The stamp tool 10 is positioned with respect to the stage 82 in the Y-axis direction by the tip surface 92 coming into contact with the edge portion 16d of the adapter plate 16 in the Y-axis direction.

Next, a description will be given of a method of picking up the stamp tool 10 from the installation stage 82 illustrated in FIGS. 6 and 7 using the transport device 20 illustrated in FIG. 2A.

First, the positioning members 90 are used to position the stamp tool 10 on the stage 82 in the Y-axis direction. Thereafter, the stage 82 moves together with the base 80 and is positioned below the transport head 22 of the transport device 20 illustrated in FIG. 2A. Note that the transport head 22 may be moved without moving the stage 82, or both of the transport head 22 and the stage 82 may be moved. The transport head 22 may be rotated around the Z-axis as necessary.

After the stamp tool 10 on the stage 82 is positioned under the transport head 22 in the Z-axis, the head 22 is moved downward along the Z-axis so that a lower end of the transport head 22 is brought into contact with the mounting surface 16a of the adapter plate 16, and vacuum adsorption by the transport head 22 is started. Next, as illustrated from FIG. 2A to FIG. 2B, the clamping mechanism 26 is closed, and the engaging surfaces 26b of the claw portions 26a are engaged with the tapered surfaces 16c located on both sides of the adapter plate 16 in the X-axis direction, respectively.

Thereafter, the pair of positioning members 90 illustrated in FIG. 7 are opened in the Y-axis direction to release contact between the edge portion 16d of the adapter plate 16 and the tip surface 92. Before and after the release, adsorption of the support plate 14 to the top surface 84 of the stage by the suction holes 85 of the stage 82 is released. Thereafter, when the transport head 22 is moved upward along the Z-axis, as illustrated in FIG. 2B, the stamp tool 10 is positioned at a lower end of the transport head 22 in the X-axis and Y-axis and is held in a state where levelness of the stamp tool 10 is maintained.

Figure 3A:
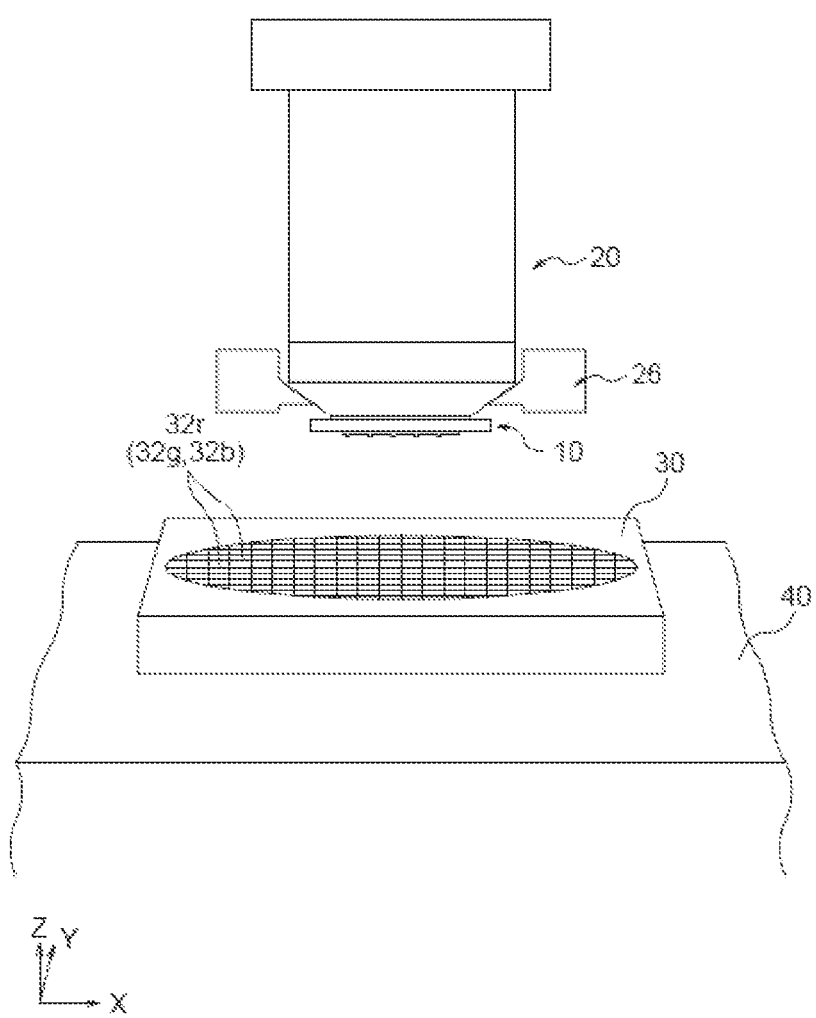
FIG. 3A is a schematic diagram of a transport device illustrating a state before picking up an element from a semiconductor substrate.

In a state where the stamp tool 10 is attached on the transport head 22 as illustrated in FIG. 2B, the transport device 20 is relatively moved in the X-axis and Y-axis directions, and is located above the element 32r formed on a surface of the element forming substrate 30 installed on an installation table 40 as illustrated in FIG. 3A. As illustrated in FIG. 5A, on the surface of the element forming substrate 30, for example, an element 32r for red light emission, an element 32g for green light emission, or an element 32b for blue light emission is incorporated. The substrate 30 may be, for example, a sapphire substrate, a glass substrate, a GaAs substrate, a SiC substrate, etc., depending on the type of device (blue light emitting device, red light emitting device, green light emitting device, etc.).

In the present embodiment, the elements 32r, 32g, and 32b are, for example, micro LED elements. Note that in the following description, only the element 32r will be described. However, the other elements 32g and 32b are also processed in a similar manner using separate stamp tools 10, respectively. The stamp tool 10 is preferably prepared for each type of the different elements 32r, 32g, and 32b. However, the transport head 22 may be used in common. The stamp tool 10 in a standby state is installed, for example, on the stage 82 illustrated in FIGS. 6 and 7, and the stamp layer 12 is sealed inside the housing recess 86 and kept clean.

Figure 3B:
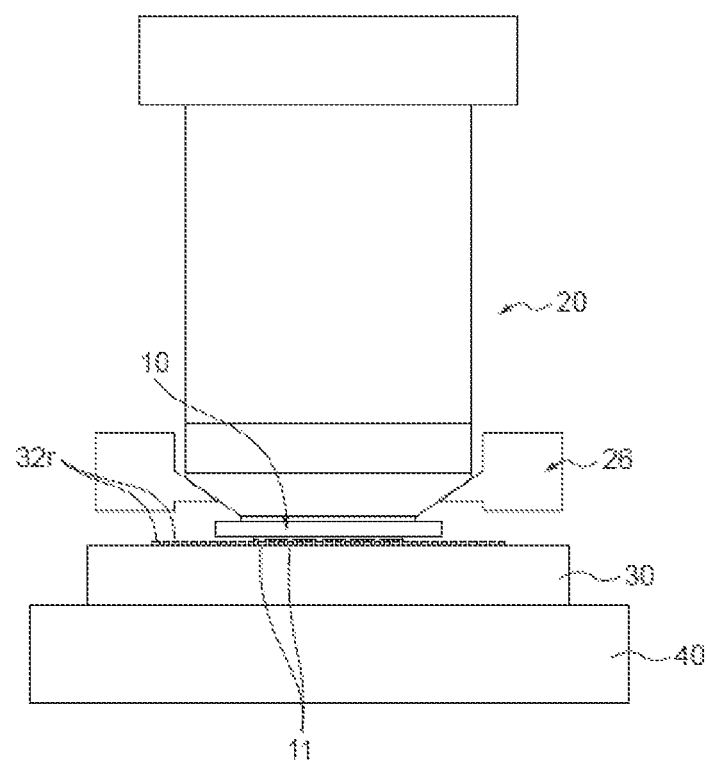
FIG. 3B is a schematic diagram of the transport device illustrating a state of pressing a stamp layer of the stamp tool against the element on the semiconductor substrate from the state illustrated in FIG. 3A.
Figure 3C:
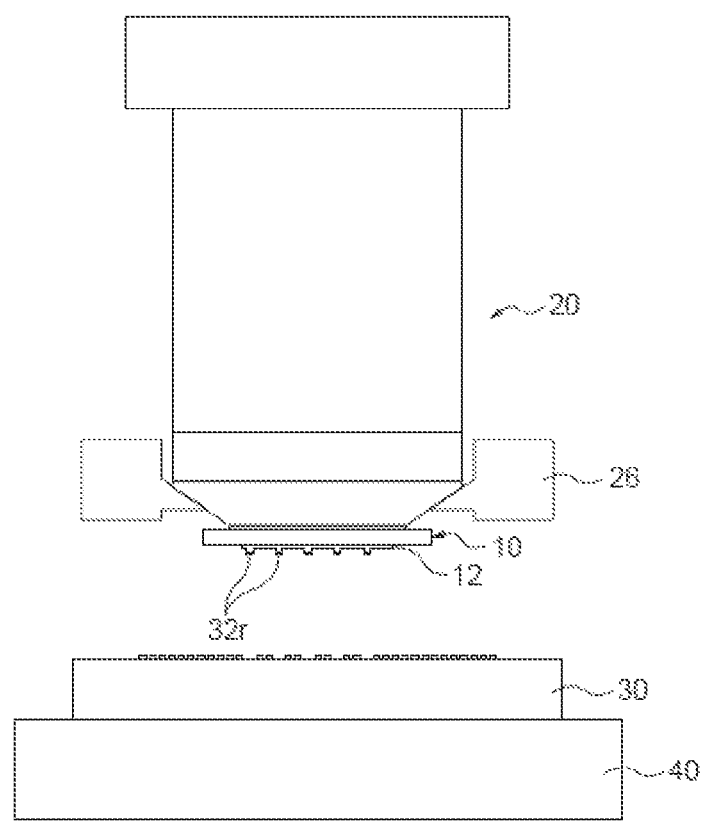
FIG. 3C is a schematic diagram of the transport device illustrating a state after picking up the element from the semiconductor substrate.
Figure 3C:
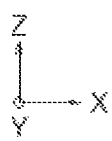

As illustrated from FIG. 3A to FIG. 3B, the transport device 20 is moved downward in the Z-axis direction to press the projection 11 of the stamp tool 10 against an upper surface of the element 32r of the substrate 30. As a result, the element 32r adheres to the projection 11. Thereafter, as illustrated in FIG. 3C, the stamp tool 10 is lifted upward in the Z-axis direction together with the transport device 20. As a result, as illustrated in FIG. 5B, the element 32r adheres to each projection 11, and the element 32r is picked up from the substrate 30 together with the projection 11. The element 32r left on the substrate 30 is similarly picked up by the stamp tool 10 of the transport device 20 later.

Next, the element 32r picked up by the projection 11 of the stamp tool 10 is transported by the transport device 20 onto the first transfer substrate (the substrate may be a sheet/which is similarly applied hereinafter) 50 illustrated in FIG. 5C and disposed on an adhesion layer 52. Alternatively, the element 32r picked up by the projection 11 of the stamp tool 10 may be transported, for example, by the transport device 20 onto a mounting substrate 70 illustrated in FIG. 5F and disposed on the mounting substrate 70 there. In the present embodiment, a transfer method is used for description.

Figure 5C:
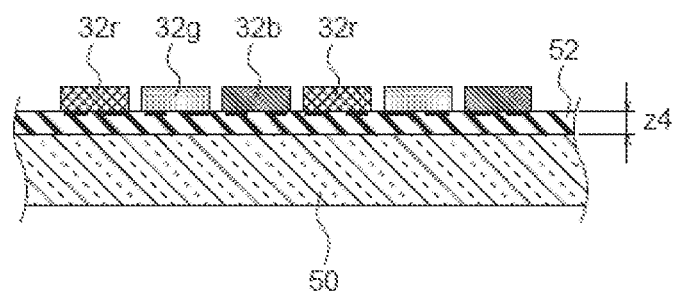
FIG. 5C is a schematic cross-sectional view illustrating a state in which the element on the semiconductor substrate is picked up by the stamp tool of the transport device and then disposed on a first transfer substrate (sheet)
Figure 5C:
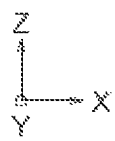

An array of the elements 32r adhering to the projections 11 of the stamp layer 12 illustrated in FIG. 5B is transferred onto the adhesion layer 52 of the substrate 50 including an adhesion sheet, etc. illustrated in FIG. 5C. To this end, the elements 32r adhering to the projections 11 of the stamp layer 12 are pressed against the surface of the adhesion layer 52, and then the stamp layer 12 is lifted together with the transport device 20. As a result, a plurality of elements 32r is transferred to the surface of the adhesion layer 52 at the same time. Note that before the transfer, the transport device 20 illustrated in FIG. 3C is moved onto the substrate 50 illustrated in FIG. 5C by a transport mechanism of the transport device 20.

The adhesion of the adhesion layer 52 of the adhesive sheet including the substrate 50 is adjusted so that the adhesion of the adhesion layer 52 is greater than the adhesion of the projections 11. The adhesion layer 52 is made of, for example, an adhesion resin such as natural rubber, synthetic rubber, acrylic resin, or silicone rubber, and a thickness z4 thereof is preferably about 0.5 to 2.0 times the height z2 (see FIG. 5B) of the elements 32r. Note that in order to smoothly move the element 32r from the projection 11 to the adhesion layer 52, an operation (for example, applying heat) may be added to facilitate peeling of the element 32r from the projection 11.

The other elements 32g and 32b are also transferred to the adhesion layer 52 of the substrate 50 in a similar manner as described above. Three elements 32r, 32g, and 32b of R, G, and B constitute one pixel unit, and by disposing these pixel units in a matrix, a color display screen can be obtained.

The other elements 32g and 32b are also transferred to the adhesion layer 52 of the substrate 50 in a similar manner as described above. Three elements 32r, 32g, and 32b of R, G, and B constitute one pixel unit, and by disposing these pixel units in a matrix, a color display screen can be obtained.

Figure 5D:
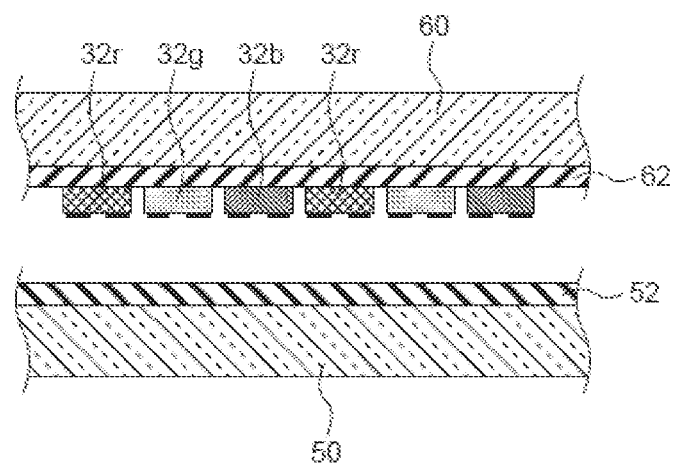
FIG. 5D is a schematic cross-sectional view illustrating a state in which an element array disposed on the first transfer substrate (sheet) is transferred to a second transfer substrate (sheet)
Figure 5D:
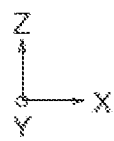

Next, as illustrated in FIG. 5D, the entire array of the three elements 32r, 32g, and 32b disposed on the surface of the first transfer substrate 50 is transferred to the adhesion layer 62 of the second transfer substrate 60, so that respective terminals of the elements 32r, 32g, and 32b are disposed to face the outside of the substrate 60. For this transfer, a technique such as a laser lift method may be used, and a transfer method using a difference in adhesion, a transfer method involving heat peeling, etc. may be used. With the terminals of the elements 32r, 32g, and 32b facing the outside of the substrate 60, a tin plating film may be formed on each terminal using an electroless plating method, etc.

Figure 5E:
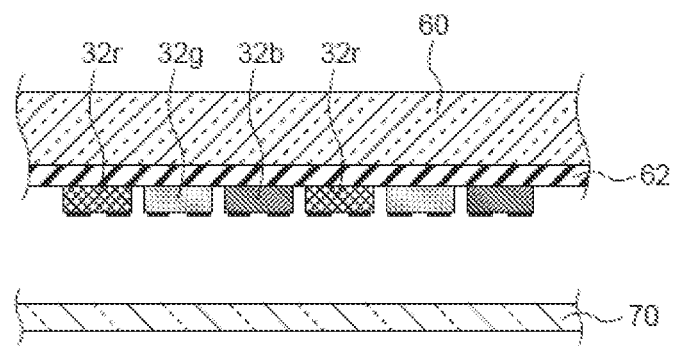
FIG. 5E is a schematic cross-sectional view illustrating a state before the element array disposed on the second transfer substrate (sheet) is transferred to a mounting substrate (sheet)
Figure 5E:
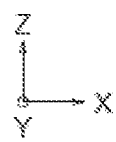
Figure 5F:
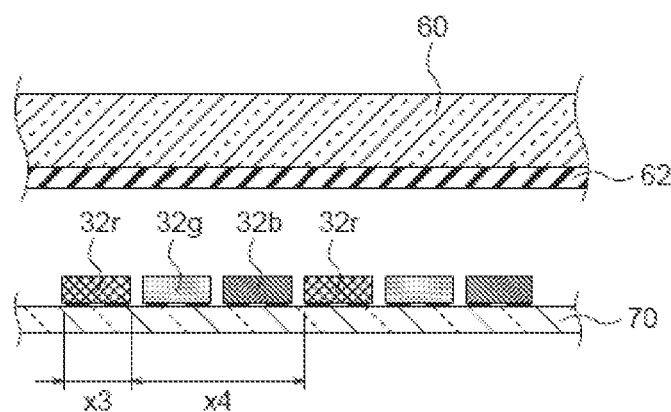
FIG. 5F is a schematic cross-sectional view illustrating a state after the element array disposed on the second transfer substrate (sheet) is transferred to the mounting substrate (sheet)

Next, as illustrated in FIGS. 5E and 5F, the entire array of the three elements 32r, 32g, and 32b is transferred from the adhesion layer 62 of the substrate 60 to the mounting substrate 70. For the transfer, a technique such as the laser lift method may be used, and a transfer method using a difference in adhesion, a transfer method involving heat peeling, etc. may be used.

Note that after the transfer, in order to connect the terminal of each of the elements 32r, 32g, and 32b to a circuit pattern of the mounting substrate, for example, it is preferable that anisotropic conductive paste (ACP) is applied to the surface of the mounting substrate 70 or an anisotropic conductive film (ACF) is disposed thereon. As illustrated in FIG. 5F, after disposing the elements 32r, 32g, and 32b on the substrate 70 via the ACP or ACF, the respective elements 32r, 32g, and 32b may be pressed toward the substrate 70 and heated using a heating/pressurizing device (not illustrated). As a result, the terminals of each of the elements 32r, 32g, and 32b can be connected to the circuit pattern of the mounting substrate.

In the transport device 20 according to the present embodiment, the mounting force F3 to the mounting surface 16a of the adapter plate 16 by the transport head 22 illustrated in FIG. 2B is greater than the fixing force F1 illustrated in FIG. 5B, and the adhesion force F2 of the projection 11 of the stamp layer 12 on the element 32r is greater than the fixing force F1. Therefore, the stamp tool 10 can easily pick up the element 32r disposed on the surface of the substrate 30 from the substrate 30 and transport the element 32r without being left on the substrate 30 side.

In addition, in the present embodiment, the mounting force F3 to the mounting surface 16a of the adapter plate 16 by the transport head 22 illustrated in FIG. 2B is a sum of the primary mounting force F3a corresponding to the adsorption force of the vacuum suction hole and the secondary mounting force F3b generated by the clamping mechanism 26 serving as the secondary attaching means. That is, in the present embodiment, only by providing the clamping mechanism 26 to a general transport head 22 having a vacuum suction hole, it becomes easy to set the mounting force F3 to the mounting surface 16a of the adapter plate 16 by the transport head 22 to be greater than the fixing force F1 of the element 32r to the substrate 30 illustrated in FIG. 5B.

Further, in the present embodiment, on both side surfaces of the adapter plate 16 in the X-axis direction, the tapered surfaces 16c are formed to decrease in outer diameter toward the stamp layer 12. In addition, the claw portion 26a of the clamping mechanism 26 can be engaged with the tapered surface 16c. With this configuration, the claw portion 26a of the clamping mechanism 26 can be easily engaged with the tapered surface 16c on the side surface of the adapter plate 16 in a detachable manner. In addition, the mounting force F3 of the stamp tool 10 to the transport head 22 by the clamping mechanism 26 can be increased.

In addition, when the tapered surfaces 16c are formed to decrease in outer diameter toward the stamp layer 12 on both side surfaces of the adapter plate 16 in the X-axis direction, rough positioning of the stamp tool 10 in the X-axis direction is facilitated along the inclined surface 89 of the guide member 88 installed in an upper part of the stage 82 illustrated in FIG. 6. In particular, as illustrated in FIG. 1A, when the maximum width of the adapter plate 16 in the X-axis direction is larger than the width of the support plate 14, the inclined surface 89 of the guide member 88 and the tapered surface 16c of the stamp tool 10 are easily engaged with each other.

In addition, the presence of the insertable surface 14c on the support plate 14 of the stamp tool 10 facilitates detachable engagement of the claw portion 26a of the clamping mechanism 26 with the tapered surface 16c on the side surface of the adapter plate 16. Further, when the adsorbable surface 14*b* is present on the support plate 14 of the stamp tool 10, as illustrated in FIG. 7, the support plate 14 can be adsorbed on the top surface 84 of the stage 82, and the stamp layer 12 is easily sealed and held inside the housing recess 86. The adsorbable surface 14*b* can be easily formed around the stamp layer 12 by configuring the support plate 14 using a glass plate, etc.

The stamp tool 10 further includes the support plate 14 to which the stamp layer 12 is fixed and to which an adapter plate 16 is replaceably attached. With this configuration, only the support plate 14 to which the stamp layer 12 is fixed can be replaced from the adapter plate 16 without replacing the entire stamp tool 10. Therefore, it becomes easy to prepare the stamp tool 10 having different types of stamp layers 12 at low cost. In addition, by using the adapter plate 16 in common, it is unnecessary to use different types of transport heads in accordance with the stamp tools, and the overall structure of the transport device can be simplified.

In the present embodiment, the plurality of projections 11 corresponding to the elements 32*r* (32*g*, 32*b*) is formed on the stamp layer 12, and the elements 32*r* (32*g*, 32*b*) detachably adhere to the respective projections 11. With this configuration, a plurality of elements 32*r* (32*g*, 32*b*) may be taken out from the substrate 30 at the same time. In the element array manufacturing method of the present embodiment, an element array having the plurality of elements 32*r* (32*g*, 32*b*) can be easily manufactured.

In addition, in the present embodiment, as illustrated in FIG. 6, the installation stage 82 is replaceably attached to the base 80. Therefore, the stage 82 corresponding to the stamp tool 10 may be prepared, and only the stage 82 may be replaced when changing to a different type of stamp tool 10. Since a degree of flatness of the stage 82 is ensured with respect to the base 80, there is no need to adjust a degree of flatness of the stamp tool 10 when the stamp tool 10 is replaced.

Therefore, in the present embodiment, the transport head 22 can favorably pick up the stamp tool 10 from the installation stage 82 without causing an error in adsorption by the transport head 22 or an error in gripping by the clamping mechanism 26.

Second Embodiment

Figure 1B:
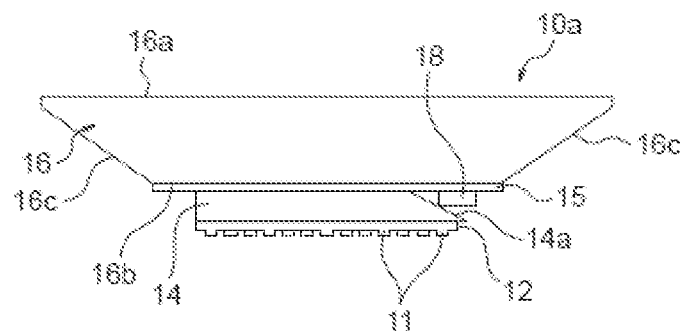
FIG. 1B is a schematic front view of a stamp tool according to another embodiment of the present invention.
Figure 1B:
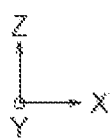

As illustrated in FIG. 1B, in a stamp tool 10*a* used in a transport device of the present embodiment, a shim plate 18 is interposed between the stamp layer 12 and the adapter plate 16 to adjust a degree of parallelism of the support plate 14. An inclined surface 14*a* is formed on a part of a side surface of the support plate, and the shim plate 18 is engaged with the inclined surface 14*a* so that the degree of parallelism of the support plate 14 can be adjusted. The degree of parallelism of the support plate 14 can be adjusted using a mode in which the shim plate 18 is installed between the support plate 14 and the adapter plate 16 via the adhesive layer 15.

Figure 1C:
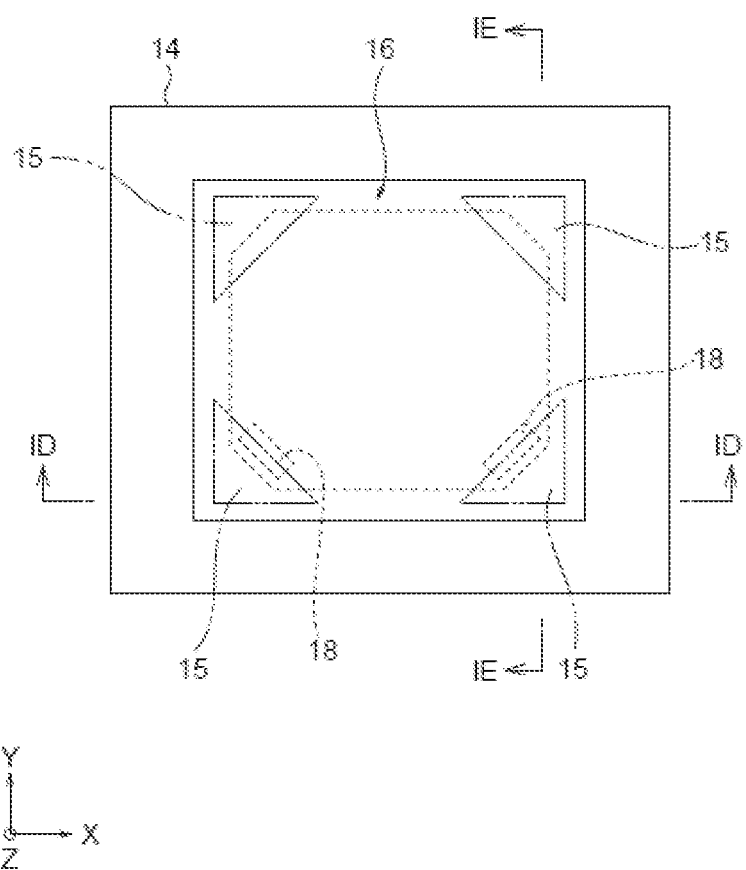
FIG. 1C is a schematic plan view of a modification example of the stamp tool of FIG. 1B.
Figure 1D:
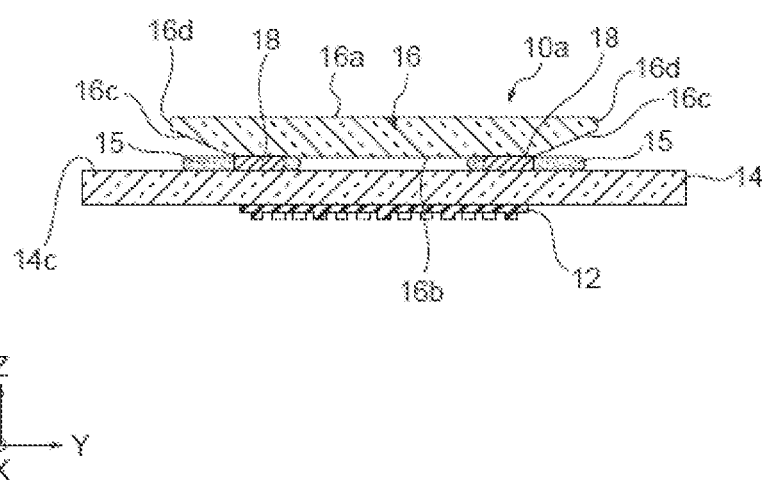
FIG. 1D is a cross-sectional view of the stamp tool taken along ID-ID illustrated in FIG. 1C.
Figure 1E:
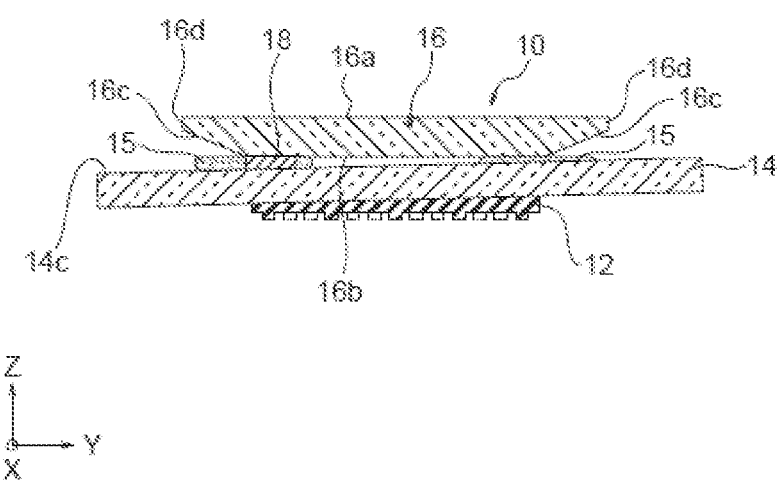
FIG. 1E is a cross-sectional view of the stamp tool taken along IE-IE illustrated in FIG. 1C.

Note that since the purpose of installing the shim plate 18 is to adjust a degree of parallelism, a position where the shim plate 18 is installed is not limited thereto. The shim plate 18 may be installed across the entire periphery of the adapter plate 16, or may be installed intermittently. For example, as illustrated in FIGS. 1C, 1D, and 1E, adhesive layers 15 may be provided at four corners of the adapter plate 16, and shim plates 18 may be provided only at two locations on one side in the Y-axis direction between the adhesive surface 16*b* and the support plate 14 with the adhesive layer 15 interposed therebetween. With this configuration, when the adapter plate 16 (or the support plate 14) has a rectangular shape, a small amount of degree of parallelism can be adjusted.

That is, as illustrated in FIG. 1C, when the adapter plate 16 (or the support plate 14) has a rectangular shape, the degree of parallelism can be adjusted by disposing the shim plate 18 on one of opposing sides. In addition, when the adapter plate 16 (or the support plate 14) has a circular shape, the degree of parallelism can be adjusted by disposing the shim plate 18 in one of circular arc regions at point-symmetrical positions.

More specifically, for example, as illustrated in FIG. 1E, when a thickness of the stamp layer 12 varies along the Y-axis direction, the shim plate 18 may be disposed in a gap between the support plate 14 and the adapter plate 16 on one side in the Y-axis direction. In this way, the mounting surface 16*a* and a stamp surface of the stamp layer 12 become parallel to each other, and the degree of parallelism can be adjusted. Note that, in FIG. 1E, in order to facilitate description, thicknesses and inclinations of the stamp layer 12, the shim plate 18, and the adhesive layer 15 are illustrated to be larger than actual thicknesses and inclinations.

Other configurations and effects of the transport device and the stamp tool of the present embodiment are the same as those of the first embodiment, and a detailed description thereof will be omitted.

Third Embodiment

Figure 4A:
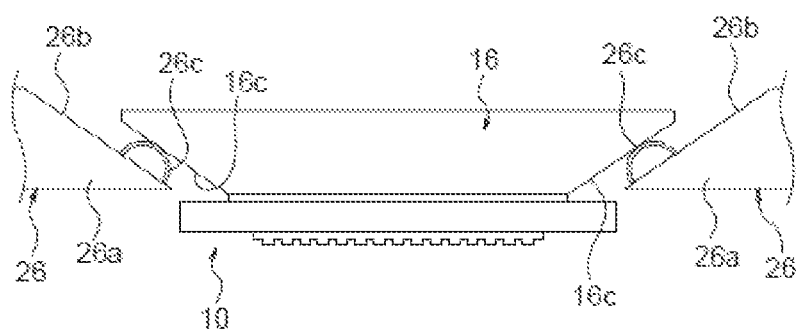
FIG. 4A is a partial schematic diagram illustrating details of a claw portion of a clamping mechanism used in a transport device according to another embodiment of the present invention.
Figure 4A:
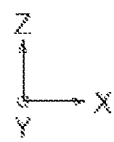
Figure 4B:
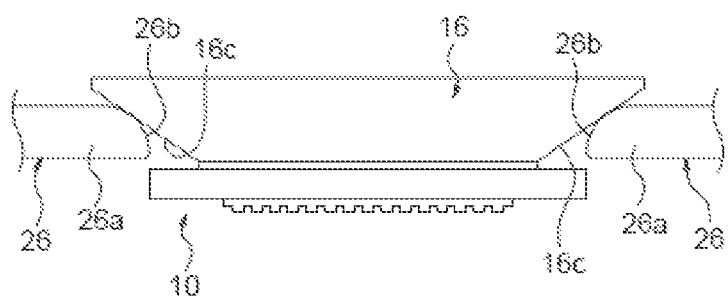
FIG. 4B is a partial schematic diagram illustrating details of a claw portion of the clamping mechanism used in the transport device according to the other embodiment of the present invention.

As illustrated in FIG. 4A, in the transport device of the present embodiment, an elastically deformable engaging projection 26*c* is attached on the engaging surface 26*b* of the claw portion 26*a* of the chuck mechanism 26, and the engaging projection 26*c* can be engaged with the tapered surface 16*c* of the adapter plate 16. The engaging projection 26*c* is made of, for example, a spring material, and may protrude in an arc shape from the engaging surface 26*b*. In addition, as illustrated in FIG. 4B, the engaging surface 26*b* does not have to be a flat surface, and may be a convex curved surface that can be engaged with the tapered surface 16*c* of the adapter plate 16. Other configurations and effects of the transport device and the stamp tool of the present embodiment are the same as those of the first or second embodiment, and a detailed description thereof will be omitted.

Note that the present invention is not limited to the above-described embodiments, and various modifications can be made within the scope of the present invention.

For example, the stamp tool is not limited to the stamp tool 10 of the embodiment described above, and other stamp tools can be used. In addition, the transport head 22 may be provided with at least one of an electrostatic adsorption mechanism, a fitting mechanism, and a screwing mechanism as a secondary attaching means other than the clamping mechanism 26. By providing these mechanisms to the transport head, it becomes easy to set the mounting force F3 to the mounting surface 16*a* of the adapter plate 16 by the transport head 22 to be larger than the fixing force F1 of the element 32*r* (32*g*, 32*b*) to the substrate 30.

In addition, in the above-described embodiments, as the primary attaching means of the transport head 22, vacuum adsorption using vacuum suction holes is used. However, in the present invention, it may be unnecessary to use vacuum adsorption, and the stamp tool 10 may be detachably attached on the transport head 22 only by the secondary attaching means such as the clamping mechanism 26.

In addition, the transport device 20 according to the present embodiment is used to pick up the elements 32r (32g, 32b) from the element forming substrate 30. However, the application is not limited thereto, and the transport device 20 may be used to pick up the elements 32r (32g, 32b) from a substrate (sheet) having an adhesion layer transferred from the substrate 30 by the laser lift method, etc.

In addition, the transport device 20 according to the present embodiment may be used to pick up an element other than the elements 32r, 32g, and 32b for red, green, and blue light emission. A fluorescent element, etc. may be indicated as another display element. In addition, the other element is not limited to the display element, and may be an electronic element such as a light receiving element, a ceramic capacitor, or a chip inductor, or a semiconductor element.

EXPLANATIONS OF LETTERS OR NUMERALS

10 STAMP TOOL
  11 PROJECTION
  12 STAMP LAYER
  14 SUPPORT PLATE
    14a INCLINED SURFACE
    14b ADSORBABLE SURFACE
    14c INSERTABLE SURFACE
  15 ADHESIVE LAYER
  16 ADAPTER PLATE
    16a MOUNTING SURFACE
    16b ADHESIVE SURFACE
    16c TAPERED SURFACE
    16d EDGE PORTION
  18 SHIM PLATE
20 TRANSPORT DEVICE
22 TRANSPORT HEAD
24 ADSORBING SURFACE
26 CHUCK MECHANISM
  26a CLAW PORTION
  26b ENGAGING SURFACE
  26c ENGAGING PROJECTION
28 OPENING/CLOSING MECHANISM
30 ELEMENT FORMING SUBSTRATE
32r, 32g, 32b ELEMENT
40 INSTALLATION TABLE
50 FIRST TRANSFER SUBSTRATE (SHEET)
52 ADHESION LAYER
60 SECOND TRANSFER SUBSTRATE (SHEET)
62 ADHESION LAYER
70 MOUNTING SUBSTRATE
80 BASE
82 STAGE
83 GAS FLOW HOLE
84 TOP SURFACE
85 SUCTION HOLE
86 HOUSING RECESS
88 GUIDE MEMBER
89 INCLINED SURFACE
90 POSITIONING MEMBER
92 TIP SURFACE

The invention claimed is:

1. A stamp tool comprising:
a stamp layer having a portion allowing a transport object element to detachably adhere thereto;
a support plate, the stamp layer being fixed to the support plate; and
an adapter plate replaceably attached to the support plate and having a mounting surface, a transport head being allowed to be detachably attached thereon.

2. The stamp tool according to claim 1, wherein the support plate is replaceably attached to the adapter plate by an adhesive layer.

3. The stamp tool according to claim 1, wherein:
the transport object element comprises elements formed on a surface of a substrate;
projections corresponding to the elements are formed on the stamp layer; and
the elements detachably adhere to the respective projections.

4. The stamp tool according to claim 1, wherein the support plate comprises a glass plate or a ceramic plate having a flat surface.

5. The stamp tool according to claim 1, wherein a tapered surface having an outer diameter decreasing toward the support plate is formed on a side surface of the adapter plate.

6. The stamp tool according to claim 1, wherein a maximum width of the adapter plate along a first axial direction is set to be larger than a width of the support plate.

7. The stamp tool according to claim 5, wherein an insertable surface facing the tapered surface of the adapter plate is provided on a surface of the support plate at a side of the adapter plate.

8. The stamp tool according to claim 1, wherein an adsorbable surface is formed around the stamp layer on a surface of the support plate at a side of the stamp layer.

9. The stamp tool according to claim 1, wherein a shim plate for adjusting a degree of parallelism of the support plate is interposed between the stamp layer and the adapter plate.

10. A method of manufacturing an element array, the method comprising:
taking out transport object elements from a substrate simultaneously and transporting the elements using the stamp tool according to claim 1.

11. A transport device comprising:
a stamp tool; and
a transport head configured to detachably transport the stamp tool, wherein:
the stamp tool includes:
a stamp layer allowing a transport object element disposed on a substrate with a predetermined fixing force to adhere into the stamp layer with predetermined adhesion force; and
an adapter plate configured to support the stamp layer, and having a mounting surface allowing the transport head to be detachably attached thereon,
a mounting force to the mounting surface of the adapter plate by the transport head is greater than the fixing force,
the adhesion force of the stamp layer to the transport object element is greater than the fixing force, and
a tapered surface having an outer diameter decreasing toward the stamp layer is formed on a side surface of the adapter plate.

12. The transport device according to claim 11, wherein the mounting force to the mounting surface of the adapter plate by the transport head includes a primary mounting force by a primary attaching means and a secondary mounting force by a secondary attaching means other than the primary attaching means.

13. The transport device according to claim 12, wherein the primary attaching means includes a vacuum suction hole formed in the transport head.

14. The transport device according to claim 12, wherein the secondary attaching means includes at least one of a clamping mechanism for detachably attaching the adapter plate to the transport head, an electrostatic adsorption mechanism, a fitting mechanism, and a screwing mechanism.

15. The transport device according to claim 14, wherein a claw portion of a clamping mechanism included in the secondary attaching means is allowed to be engaged with the tapered surface formed on the side surface of the adapter plate.

16. A transport device comprising:
a stamp tool; and
a transport head configured to detachably transport the stamp tool, wherein:
the stamp tool includes:
    a stamp layer allowing a transport object element disposed on a substrate with a predetermined fixing force to adhere into the stamp layer with predetermined adhesion force; and
    an adapter plate configured to support the stamp layer, and having a mounting surface allowing the transport head to be detachably attached thereon,
a mounting force to the mounting surface of the adapter plate by the transport head is greater than the fixing force,
the adhesion force of the stamp layer to the transport object element is greater than the fixing force,
the stamp tool further includes a support plate on which the stamp layer is fixed, and
the adapter plate is replaceably attached to the support plate.

17. The transport device according to claim 16, wherein the support plate is replaceably attached to the adapter plate by an adhesive layer.

18. The transport device according to claim 11, wherein:
the transport object element comprises elements formed on a surface of a substrate;
a plurality of projections corresponding to the elements is formed on the stamp layer; and
the elements detachably adhere to the respective projections.

19. A method of manufacturing an element array, the method comprising:
taking out and transporting a plurality of elements as transport object elements from the substrate simultaneously and transporting the elements using the transport device according to claim 11.

* * * * *